United States Patent [19]

Ito et al.

[11] Patent Number: 5,135,807
[45] Date of Patent: Aug. 4, 1992

[54] DIAMOND-COATED MEMBER AND PROCESS FOR THE PREPARATION THEREOF

[75] Inventors: Toshimichi Ito, Tokyo; Masaya Tsubokawa; Nariyuki Hayashi, both of Sodegaura, all of Japan

[73] Assignee: Idemitsu Petrochemical Company Limited, Tokyo, Japan

[21] Appl. No.: 601,790

[22] PCT Filed: Mar. 9, 1990

[86] PCT No.: PCT/JP90/00308

§ 371 Date: Nov. 9, 1990

§ 102(e) Date: Nov. 9, 1990

[87] PCT Pub. No.: WO90/10725

PCT Pub. Date: Sep. 2, 1990

[30] Foreign Application Priority Data

Mar. 10, 1989 [JP] Japan ................................. 1-59349

[51] Int. Cl.$^5$ .................. B32B 9/04; B32B 15/04; C23C 16/00

[52] U.S. Cl. .................. 428/334; 427/248.1; 427/255.2; 428/408; 428/457

[58] Field of Search ............. 428/408, 457, 334, 248.1

[56] References Cited

U.S. PATENT DOCUMENTS

4,707,384  11/1987  Schachner et al. ................. 427/249

FOREIGN PATENT DOCUMENTS

| | | |
|---|---|---|
| 58-126972 | 7/1983 | Japan . |
| 61-117281 | 6/1986 | Japan . |
| 62-10301 | 3/1987 | Japan . |
| 62-32268 | 7/1987 | Japan . |
| 63-215597 | 9/1988 | Japan . |
| 63-286575 | 11/1988 | Japan . |
| 63-307196 | 12/1988 | Japan . |

OTHER PUBLICATIONS

Patent Abstracts of Japan, vol. 13, No. 101, Mar. 9, 1989; JP-A-63 277 593.
Patent Abstracts of Japan, vol. 11, No. 361, Nov. 25, 1987; JP-A-62 133 068.
Patent Abstracts of Japan, vol. 12, No. 421, Nov. 8, 1988; JP-A-63 153 275.

*Primary Examiner*—Thomas J. Herbert, Jr.
*Attorney, Agent, or Firm*—Armstrong & Kubovcik

[57] ABSTRACT

The present invention relates to a diamond-coated member characterized by superposing an acicular diamond layer, an intermediate layer formed by a metal belonging to either of the group IIIb, IVa, Va or VIa of the periodic table or by a compound containing the said metal, Si or B, and a non-acicular diamond layer on the surface of a base material and to a process for the preparation of a diamond-coated member characterized in that a diamond layer is formed on the surface of a base material by vapor phase synthesis method; the resulting diamond layer is converted into acicular diamond by exposing the resulting diamond layer to a gas obtainable by exciting an oxygen-containing etching gas; an intermediate layer comprising a metal belonging to either of the group IIIb, IVa, Va or VIa of the periodic table or by a compound containing the said metal, Si or B is formed on the resulting acicular diamond; and the resulting intermediate layer is exposed to a gas obtainable by exciting a raw material gas containing a carbon source gas. The diamond-coated member according to the present invention is useful as cutting tools and abrasion resistant members.

12 Claims, No Drawings

DIAMOND-COATED MEMBER AND PROCESS FOR THE PREPARATION THEREOF

DESCRIPTION

Technical Field

The present invention relates to a diamond-coated member and a process for the preparation of the diamond-coated member and, more particularly, to a diamond-coated member which can appropriately be used for tools and various members, such as various super hard tools, abrasion resistant tools and so on, e.g., cutting tools, which require a high degree of hardness and abrasion resistance and to a process for the preparation of the diamond-coated member.

Background Technology

Heretofore, super hard alloys, sintered diamond, single crystal diamond and so on have been used for tools, such as cutting tools, abrasive tools, super hard tools, e.g., dies, abrasion resistant tools and so on, which require a high degree of hardness and abrasion resistance.

Among these, a so-called diamond tool using a diamond is particularly preferred due to its remarkably excellent hardness, abrasion resistance and so on.

Heretofore, the diamond tools are constructed such that a sintered diamond or a single crystal diamond is fixed, for example, by brazing or the like, on the surface of the member such as a super hard alloy or a high hard metal.

On the other hand, recent years, extensive review has been made on the preparation of the diamond-coated members by means of the diamond synthesis technology based on vapor phase method such as CVD method, PVD method or the like, thereby forming a diamond film on the base material such as super hard alloys or high hard metals, and attempts have been made to apply those diamond-coated members to the uses as described hereinabove.

It is to be noted herein that diamond is the hardest substance and it is remarkably superior to other substances in many respects, such as abrasion resistance, heat resistance, thermal conductivity, chemical resistance, radiation resistance and so on, so that the diamond film to be formed on the surface of the base material such as the super hard alloys, sintered ceramics and so on is considered capable of being utilized effectively as a coating member for providing the base materials with a high degree of hardness, abrasion resistance and so on, as a protective film for various base materials, and so on.

For example, the formation of the diamond film of a sufficiently thick film thickness on the surface of the base material such as the super hard alloy to be used for the super hard tools such as cutting tools, abrasive tools and so on can provide super hard tools with further improved performance.

It can be noted, however, that the surface of the super hard alloy is usually poor in adhesion to the diamond film to be deposited by usual vapor phase synthesis method and, in particular, that an increasingly thicker film thickness of the diamond film further reduces the adhesion, thereby resulting in the likelihood to cause separation of the diamond film from the base material, or the like, and so far providing no commercially valuable tool. Therefore, a great deal of improvement in adhesion and so on has been desired.

Hence, technology has been proposed which forms an intermediate layer between the super hard alloy and the diamond film in order to improve adhesion between the surface of the super hard alloy and the diamond.

For example, Japanese Patent Unexamined Publication (kokai) No. 58(1983)-126,972 discloses a super hard alloy with a diamond film deposited by forming an intermediate layer comprising one member or more selected from a carbide, a nitride, a boride and an oxide of a metal belonging to the group IVa, Va or VIa on the surface of the super hard alloy and thereafter by forming the diamond film on the resulting intermediate layer.

However, the method as disclosed in the above patent publication is stated such that the disposition of the intermediate layer improves the adhesion, however, the adhesion is still insufficient and there are problems that in particular when the film thickness of the diamond film is increased, the adhesion is so reduced that the diamond film is likely to come off, etc., and this method does not yet provide a super hard alloy with a diamond film of such a commercial level as having performance as comparable as sintered diamond-coated members such as super hard tools coated with the sintered diamond.

Therefore, as attempts to make a film thickness of the diamond film sufficient thick or to produce a member coated with a diamond film having excellent performance, there have been proposed technology which provides a structure in which the diamond layer and the intermediate layer are laminated in an alternating way and technology which forms a multilayer diamond film on the base material.

For example, Japanese Patent Examined Publication (kokoku) No. 62(1987)-10,301 discloses tool members their surface coated, having an alternating laminate structure which comprises at least a layer of a diamond film formed by the vapor phase synthesis method and at least a layer of a hard compound composed of a monolayer comprising one member selected from a carbide, a nitride, a carbonitride and a carbonated nitride of a metal belonging to the group IVa, Va and VIa, Si and B or a bilayer or a multilayer containing two members or more selected therefrom, respectively, which are formed on the surface of a tool member formed by an alloy substrate containing an iron family metal as a major component.

However, conventional diamond film-coated members with such an intermediate layer present the problems that the adhesion between the layers, particularly the adhesion of the diamond film to the intermediate layer, is still insufficient due to the reasons that the diamond film is deposited by means of the usual vapor phase synthesis method alone and that it is difficult to ensure a substantial film thickness of the diamond film, and so on.

As a method for using the diamond film as an intermediate layer, that is, as technology for forming a multilayer diamond layer on the base material by the vapor phase synthesis method, there is known a process as disclosed, for example, in Japanese Patent Unexamined Publication (kokai) No. 63(1988)-307,196.

This multilayer diamond film comprises a first layer composed of a finely crystalline diamond formed on the base material and a second layer composed of a diamond film formed on the first layer so as for its crystal plane (110) to have a specified crystallographical direction parallel to the base material, and this publication proposes, as the method for synthesizing the finely crystalline diamond layer as the first layer, the vapor phase sythesis method in which methane in a relatively high concentration is used as the carbon source gas, or a method which involves forming the finely crystalline diamond film on a silicon wafer polished with a diamond paste and then subjecting the diamond film as the second layer to etching treatment by pure hydrogen gas plasma so as to make the orientation of its crystal plane constant with respect to the base material.

For this multilayer diamond layer, however, the diamond film as the first layer is an aggregate of fine crystals of diamond, so that the adhesion of the diamond film to the base material can be improved to a higher extent than that formed by the usual vapor phase synthesis method, but the effect of improving the adhesion is not yet sufficient and it is difficult that the resulting diamond film can simultaneously and sufficiently satisfy characteristics, such as the adhesion, the film thickness of the diamond film, the ability of relaxing a stress, etc., which are required for super hard tools, in particular such as cutting tools and so on.

As a process for the preparation of the diamond film in association with the etching treatment by the above gas plasma, Japanese Patent Unexamined Publication (kokai) No. 63(1988)-215,597 proposes a process which involves introducing a reaction gas containing hydrogen, oxygen, nitrogen or the like yet no carbon, and a raw material gas containing various carbons onto the surface of the base material in a discontinuous manner and generating plasma by means of high frequency discharge, thereby removing a portion different from the diamond in the diamond film deposited on the base material more effectively than conventional vapor phase synthesis methods.

It is to be noted that this method is intended to improve mainly the hardness and electrical characteristics of the diamond film by making the purity of the resulting diamond film and consequently approaching it to a diamond film close to natural diamond. Although this method can expect an improvement in the adhesion to some extent by the etching treatment, it is difficult to simultaneously and sufficiently satisfy the characteristics such as the adhesion, the film thickness of the diamond film, the ability of relaxing the stress, which are required for the super hard tools and so on, particularly such as cutting tools and so on.

The present invention is completed under the circumstances as described hereinabove.

The object of the present invention is to provide a diamond-coated member and a process for the preparation of the diamond-coated member, which has a diamond film with remarkably improved adhesion yet which can retain its adhesion to a sufficient extent even if the film thickness of the diamond film would become substantially thicker, which has such excellent characteristics as being unlikely to cause damages, such as coming off, and which can provide the diamond-coated members such as diamond-coated tools and so on having performance as comparable as sintered diamond-coated members such as conventionally available sintered diamond-coated super hard tools and so on.

DISCLOSURE OF INVENTION

The present invention to be performed in order to solve the problems as described hereinabove comprises a diamond-coated member characterized by superimposing an acicular diamond layer, an intermediate layer comprising a metal belonging to either of the group IIIb, IVa, Va or VIa of the periodic table or a compound containing the said metal, Si or B, and a nonacicular diamond layer on the surface of a base material; and a process for the preparation of the diamond-coated member characterized by forming a diamond layer on the surface of the base material by vapor phase deposition method; converting the diamond layer into the acicular diamond layer by exposure to a gas obtainable by exciting an oxygen-containing etching gas; then forming the intermediate layer containing the metal belonging to either of the group IIIb, IVa, Va or VIa or a compound containing the said metal, Si or B on the acicular diamond, and bringing the intermediate layer into contact with a gas obtainable by exciting a raw material gas containing a carbon source gas.

The diamond-coated member and the process for the preparation of the diamond-coated member according to the present invention will be described in more detail hereinafter.

BASE MATERIAL

As the base material to be used for the formation of the multilayer diamond film, there may be used any material which can form the diamond layer on a surface thereof, and the base material may conveniently be chosen from a variety of known materials to be used for the formation of the diamond film by means of the vapor phase deposition method in accordance with the purposes.

As the base materials, there may be mentioned, for example, a metal such as silicon, manganese, vanadium, thallium, aluminum, titanium, tungsten, molybdenum, germanium, chromium, and so on, an oxide of the metal, a nitride and a carbide thereof, an alloy thereof, a cermet of an $Al_2O_3$—Fe type, a TiC—Ni type, a TiC—Co type, a $B_4C$—Fe type and so on, and various sintered ceramics.

As the base material to be used appropriately for using the multilayer diamond film for super hard tools such as cutting tools and so on, there may be mentioned, for example, a sintered super hard alloys and so on, such as a WC-Co type alloy, a WC-TiC-Co type alloy, a WC-TiC-TaC-Co type alloy, a WC-TiN-Co type alloy, a WC-TiC-TiN-Co type alloy and so on. Among these super hard alloys, the one containing Co at the rate of 1 to 30% by weight is particularly preferred. It is also preferred to use the sintered ceramics consisting of a mixture selected from $Si_3N_4$, TiC, WC, TiN, SiC, $Y_2O_3$, MgO, $Al_2O_3$ and so on.

When this multilayer diamond film is utilized for circuit boards in the electronic field and so on, the base material includes silicon wafer or its processed products, and so on.

In order to improve adhesion to the diamond film to be formed by the vapor phase deposition method, these base materials may be surface-treated or treated by coating or may be provided with an intermediate layer comprised of, for example, tungsten, titanium, tantalum, alumina, silicon, a carbide thereof, an oxide thereof, a nitride thereof, a boride thereof or the like. These treatment can serve as further improving adhesion of the acicular diamond film to the base material, and other properties.

Although the shape of the base material is not restricted to a particular one, the base material may be adapted so as to take the form of various tools, such as cutting tips, drills, dies and so on, when this diamond-coated member is used as the tool.

ACICULAR DIAMOND LAYER

The acicular diamond layer formed on the base material may be composed of an acicular diamond (the term "acicular diamond" referred to in this specification is intended to mean so as to contain a fine diamond having a needle-shaped structure, such as a fine diamond of a needle-like crystal form, or to contain a comparably fine diamond having a structure having a length/diameter ratio of approximately 3 to 10) and a substance or substances for structuring the intermediate layer, as will be described hereinafter, which exists or exist on the surface (periphery or tip) of the acicular diamond.

The method for the formation of the acicular diamond may be carried out in accordance with known methods, such as methods as disclosed in "MUKI ZAIKEN NEWS, No. 112, October, 1988; NEW DIAMOND, Vol. 1, No. 1".

The film thickness of the diamond layer itself is not restricted to a particular one and it may range usually from approximately 0.1 to 100 microns, preferably from approximately 0.2 to 50 microns, more particularly from approximately 0.3 to 20 microns.

If the film thickness of the diamond layer would be thinner than 0.1 micron, on the one hand, the diamond-coated film may become likely to come off. If the film thickness of the diamond layer would be thicker than 100 microns, on the other hand, an improvement in adhesion of the diamond-coated film may not be seen in accordance with an increase in the film thickness and it is disadvantageous all the worse because the manufacturing time may become longer and the manufacturing cost may become expensive.

The aspect ratio of the acicular diamond structuring the acicular diamond layer may range usually from 3 to 200, preferably from 5 to 100.

If the aspect thereof would be less than 3, a sufficient degree of the adhesion of the non-acicular diamond film to the base material may not be gained or the effect of relaxing a stress against the non-acicular diamond film may not be achieved to a sufficient extent.

Although the direction of orientation of the acicular diamond structuring the acicular diamond layer with respect to the base material is not restricted to a particular direction, it is usually preferred that the longitudinal direction of the acicular diamond is vertical or nearly vertical to the surface of the base material.

It is further to be noted that the edge surface of the acicular diamond is preferably of the plane [100].

The density of the acicular diamonds obtainable in the manner as described hereinabove may range usually from $10^3$ to $10^6$ pieces per $mm^2$, preferably from $2 \times 10^3$ to $5 \times 10^5$ pieces per $mm^2$.

If the density of the acicular diamonds would be coarser than $10^3$ pieces per $mm^2$, for example, a cutting tool made of the diamond-coated member according to the present invention may incur a decrease in its cutting efficiency. On the other hand, if the density of the acicular diamonds would be higher than $10^6$ pieces per $mm^2$, the diamond-coated member having sufficient degrees of the adhesion of the acicular diamond layer to the base material and the effect of relaxing the stress, and sufficient heat and impact resistance may not be provided.

The density of the acicular diamonds may be controlled by scratching the surface of the base material by fine powders of diamond having a particle size different from the acicular diamonds, or the like.

The scratching treatment may conveniently be carried out by adopting the method comprising dispersing the fine powders of diamond in a liquid, placing the base material in this liquid, and irradiating the base material with ultrasonic waves from peripheral directions. In this case, changes of the particle size of the diamond fine powders to from several microns to several tens of microns or changes of the period of time for treatment with ultrasonic waves may control the density of the acicular diamonds.

The non-acicular diamond is formed partially or wholly among the needle-shaped crystals in the acicular diamond during the formation of the non-acicular diamond layer as will be described hereinafter.

FORMATION OF ACICULAR DIAMOND

The acicular diamond may be formed by forming the diamond layer on the surface of the base material by the vapor phase deposition method and exposing the resulting diamond layer to the gas obtainable by exciting the oxygen-containing etching gas.

The synthesis of the diamond film by means of the vapor phase deposition method may be carried out, for example, by introducing the raw material gas containing the carbon source gas into a reaction chamber in which the base material is placed, and exposing the base material to the gas obtainable by exciting the raw material gas.

The raw material gas may be any one as long as it contains at least the carbon source gas and its specific example may include, for example, a mixed gas consisting of the carbon source gas and hydrogen gas.

As the conditions for synthesizing the diamond film prior to processing into the acicular diamond by etching, it is preferred to use a temperature of the base material lower than and a concentration of the carbon source gas higher than the conditions to be used for usual diamond synthesis.

A carrier gas such as an inert gas or the like may be used, as needed, together with the raw material gases.

As the carbon source gases, there may be used gases of various hydrocarbons, halogen-containing compounds, oxygen-containing compounds, nitrogen-containing compounds and so on.

The hydrocarbon compounds may include, for example, a paraffin type hydrocarbon, such as methane, ethane, propane, butane and so on; an olefin type hydrocarbon, such as ethylene, propylene, butylene and so on; an acetylene type hydrocarbon, such as acetylene, allylene and so on; a diolefin type hydrocarbon, such as butadiene and so on; an alicyclic hydrocarbon, such as cyclopropane, cyclobutane, cyclopentane, cyclohexane and so on; an aromatic hydrocarbon, such as cyclobutadiene, benzene, toluene, xylene, naphthalene and so on; a halogenated hydrocarbon, such as methyl chloride, methyl bromide, methylene chloride, carbon tetrachloride and so on.

As the oxygen-containing compounds, there may be enumerated, for example, a ketone such as acetone, diethyl ketone, benzophenone and so on; an alcohol such as methanol, ethanol, propanol, butanol and so on; an ether such as methyl ether, ethyl ether, methyl ethyl ether, methyl propyl ether, phenol ether, dioxane and so on; an aldehyde such as formaldehyde, acetaldehyde, benzaldehyde and so on; an organic acid such as acetic acid, propionic acid, succinic acid and so on; an acid ester such as methyl acetate, ethyl acetate and so on; a divalent alcohol such as ethylene glycol, diethylene glycol and so on; carbon monoxide, carbon dioxide, and so on.

The nitrogen-containing compounds may include, for example, an amine such as trimethyl amine, triethyl amine and so on.

Further, what is not a single substance may also be used as the carbon source gas, and such may include, for example, a mixture of various hydrocarbons, such as gasoline, kerosene, gas oil and so on.

Among those carbon source gases, what is in a gaseous state at ambient temperature or what is high in vapor pressure is preferred and such may include, for example, the paraffin type hydrocarbons such as methane, ethane, propane and so on, and the oxygen-containing compounds including the ketones such as acetone, benzophenone and so on, the alcohols such as methanol, ethanol and so on, carbon monoxide and carbon dioxide gases, and so on.

The hydrogen gas is not restricted to a particular kind, and the hydrogen gas may preferably be used which is obtained by gasification of petroleum and so on, reforming of natural gas, water gas and so on, electrolysis of water, reaction of iron with steam, complete gasification of coal, and so on, and which is then purified to a sufficient extent.

As the raw material gas which can preferably be used particularly for the formation of the diamond film, there may be mentioned a mixed gas of methane gas and hydrogen gas, a mixed gas of carbon monoxide gas and hydrogen gas, and so on.

For instance, when the mixed gas of carbon monoxide gas and hydrogen gas is used as the raw material gas, the rate of the carbon monoxide gas as the carbon source gas may be usually 1% by volume or larger, preferably in the range from 5% to 80% by volume, more preferably in the range from 10% to 70% by volume.

If the rate of the carbon monoxide is less than 1% by volume, no acicular diamond layer may sometimes be formed. From the similar reason, when the mixed gas of methane gas and hydrogen gas is employed as the raw material gas, the rate of methane gas as the carbon source gas may be usually 1% by volume or larger, preferably in the range from 3% to 6% by volume, more preferably in the range from 3% to 5% by volume.

The amount of the raw material gas to be supplied to the reaction chamber may vary with a content of the carbon source gas in the raw material gas or with the type of the reaction system, i.e., a continuous system or a discontinuous system, so that it cannot uniformly be determined. The amount of the raw material gas, however, may range usually from 1 to 1,000 sccm, preferably 10 to 500 sccm.

The procedures of synthesizing the diamond by exciting the raw material gas may include, for example, microwave plasma CVD method, RF plasma CVD method, DC plasma CVD method, heat filament method, thermal CVD method, optical CVD method, combustion flare method, sputtering method, and so on. Among these methods, preferred are various plasma CVD methods (including magnetic-field plasma CVD method).

The surface temperature of the base material in the reaction chamber in forming the diamond film may range usually from 350° C. to 1,200° C., preferably from 600° C. to 1,100° C.

If the surface temperature would be lower than 350° C., the velocity of depositing the diamond film on the base material may become too slow or the diamond film may contain a large quantity of non-diamond ingredients. On the other hand, if the temperature would exceed 1,200° C., the diamond film deposited on the base material may be removed by etching or the speed of depositing the diamond film may not be improved.

The reaction pressure in the reaction chamber may range usually from $10^{-6}$ to $10^3$ torr, preferably from $10^{-3}$ to $10^3$ torr, particularly preferably from $10^{-1}$ to 800 torr.

If the reaction pressure would be lower than $10^{-6}$ torr, on the one hand, the speed of depositing the diamond film may become too slow or no diamond film may be deposited. If the reaction pressure would become higher than $10^3$ torr, on the other hand, the effect cannot be achieved so as to correspond to the elevated reaction pressure.

The reaction time cannot be determined uniformly because it may vary with the kind of the raw material gas, the composition of the gas to be used, the temperature of the base material, the reaction pressure, the film thickness required, and so on.

The film thickness of the diamond film to be deposited on the base material is not restricted to a particular film thickness, however, it is appropriate to adjust an average height of the acicular diamond obtainable by etching so as to become within the film thickness of the acicular diamond layer. Hence, the film thickness of the diamond film may range usually from approximately 0.1 micron to 100 microns, preferably from approximately 0.2 micron to 50 microns.

The diamond film thus formed is then brought into contact with the gas obtainable by exciting the oxygen-containing etching gas, thereby removing off a diamond-like carbon and a non-diamond ingredient such as graphite and so on, contained in the diamond film, and forming the acicular diamond from the diamond film.

The kind of the oxygen-containing etching gas is not restricted to a particular one as long as it contains an oxygen atom or atoms. The oxygen-containing etching gas may include, for example, an oxygen-containing gas such as oxygen, air, carbon monoxide, carbon dioxide, steam, hydrogen peroxide, various nitrogen oxides and so on, and a mixed gas with hydrogen gas, halogen gas, nitrogen gas, argon gas or other gases as well. Among these oxygen-containing gases, oxygen gas and air-containing gas are preferred.

As the procedures for exciting the oxygen-containing gas, there may be mentioned, for example, methods utilizing heat or plasma. Furthermore, there may appropriately be adopted high frequency plasma discharge method, RF plasma discharge method, DC plasma discharge method, microwave plasma discharge method and so on (including magnetic field discharge method).

The amount of the etching gas to be fed to the reaction chamber may range from 1 to 1,000 sccm, preferably from 10 to 500 sccm.

If the amount of the etching gas would be less than 1 sccm, on the one hand, the etching speed may be reduced. If the amount of the etching gas would exceed 1,000 sccm, on the other hand, the discharge may become unstable when, for example, the microwave discharge method would be adopted for the procedure of exciting the etching gas.

The temperature on the surface of the diamond film may usually range from 350° C. to 1,200° C.

If the surface temperature of the diamond film would be lower than 350° C., the non-diamond ingredients contained in the diamond film may not sometimes be removed to a sufficient extent. If the surface temperature thereof would be higher than 1,200° C., the diamond ingredient once deposited may be etched, too.

The reaction pressure may range usually from $10^{-6}$ to $10^3$ torr, preferably from $10^{-5}$ to 800 torr.

If the reaction pressure would be lower than $10^{-6}$ torr, the etching speed may be reduced. If the reaction pressure would become higher than $10^3$ torr, the effect corresponding to this elevated reaction pressure cannot be attained.

Although the period of time required for etching treatment cannot be determined uniformly because it may vary with the film thickness and the reaction conditions, the etching time may range usually from approximately 5 minutes to 2 hours.

By exposing the diamond film to the excited etching gas, the diamond may be formed in the form of a long axis, namely, in the acicular form.

It is to be noted herein that the shapes and the average height of the acicular diamonds may appropriately be adjusted by the film thickness of the diamond film to be deposited on the base material, the etching conditions and degrees in the etching treatment, and so on.

On the acicular diamond formed in the manner as described hereinabove is then formed a substance for the intermediate layer by means of the vapor phase method such as vapor evaporation or the like in such a manner as will be described hereinafter, thereby providing the intermediate layer on the surface (peripheral and edge portions) of the acicular diamond.

INTERMEDIATE LAYER AND ITS FORMATION

The intermediate layer is formed by the metal belonging to either of the group IIIb, IVa, Va or VIa of the periodic table or by the compound containing the said metal, Si or B.

The metal may include W, Mo, Cr, Ta, Nb, V, Hf, Zr and Ti.

The compound containing the metal may include, for example, the nitride of the metal, carbide thereof, carbonitride thereof, and so on. Specifically, the compound may include, for example, TaN, HfN, TiN, WC, $Mo_2C$, VC, ZrC, TiC, $TiC_{0.3}N_{0.7}$, $TiC_{0.2}N_{0.6}O_{0.2}$, and so on.

The compound containing Si or B may include, for example, SiC, $Si_3N_4$, $B_4C$, and so on.

Among these, W, Mo, WC, SiC, $B_4C$, $WSi_2$, $Si_3N_4$, TiC, TiN, and so on, may be preferred.

These metals and compounds may be used singly or in combination of two or more.

In accordance with the present invention, it is adequate that the film thickness of the intermediate layer (the thickness to be formed on the surface of the acicular diamond) may range usually from approximately 0.05 micron to 10 microns, preferably from approximately 0.1 micron to 5 microns. If the film thickness would be thinner than 0.05 microns, on the other hand, no adhesion may be improved. If the film thickness would be thicker than 10 microns, on the other hand, the effect may not be achieved so as to correspond to such thickness.

The intermediate layer may be formed, for example, by vacuum evaporation method, ion plating method, thermal CVD method, plasma CVD method, MOCVD method, sputtering method or the like.

It is to be noted that the intermediate layer may be formed in layers on the surface of the acicular diamond standing upright and tight together and at the same time on the surface of the base material among crystals of the acicular diamond as well. Further, the intermediate layer may be formed to an arbitrary depth from the tip of the acicular diamond by turning the base material on its axis while inclining it at an appropriate angle to a source of evaporation by adopting the vacuum evaporation method, ion plating method or the like. In forming the layer of the metal carbide as the intermediate layer, the metal layer is first formed and thereafter subjected to carbonization at an early stage of the step of forming the diamond.

NON-ACICULAR DIAMOND LAYER

In accordance with the present invention, the non-acicular diamond layer is formed on the intermediate layer formed in the manner as described hereinabove.

The formation of the non-acicular diamond layer may conveniently be carried out by using the method of forming the diamond film by means of a variety of conventional vapor phase synthesis methods.

This non-acicular diamond layer may be obtained, for example, by introducing the raw material gas containing the carbon source gas into the reaction chamber in which the base material with the acicular diamond layer and the intermediate layer deposited on the surface thereof is placed and then by bringing the intermediate layer into contact with the gas obtainable by exciting the raw material gas.

The non-acicular diamond layer may be formed in substantially the same manner as in the item entitled "Formation of Acicular Diamond" described hereinabove.

The film thickness of the non-acicular diamond layer may range usually from 0.5 micron to 200 microns, preferably from 0.5 micron to 50 microns.

By the formation of the non-acicular diamond layer, the non-acicular diamond is formed in interstices among crystals of the acicular diamonds in the acicular diamond layer. In this case, the non-acicular diamond may be formed with a portion of the interstices among the acicular diamonds left unfilled with the non-acicular diamonds by selecting the conditions for forming the non-acicular diamonds.

DIAMOND-COATED MEMBER

The diamond-coated member according to the present invention has an intermediate built-up layer interposed between the base material and the non-acicular diamond layer as the surface layer, the intermediate built-up layer being of a structure in which the non-acicular diamonds, the intermediate layer, and the acicular diamonds are interlaced with each other. The disposition of the intermediate built-up layer serves as physically connecting the diamond layer as the surface layer securely to the base material. Further, the intermediate built-up layer is a mixture of the diamonds and a substance or substances forming the intermediate layer, and a thermal expansion coefficient of the intermediate built-up layer may be adjusted to a value between those of the base material and the non-acicular diamond layer as the surface layer by appropriately selecting the size and density of the acicular diamond and the kind of the substance or substances forming the intermediate layer. This is highly desirable in joining substances having different thermal expansion coefficients to each other.

The thickness of the intermediate built-up layer can be set to a value required for and sufficient for easing the stress to be caused by the difference between the thermal expansion coefficients of the non-acicular diamond as the surface layer and the base material merely by appropriately selecting the height and size of the acicular diamonds, thereby connecting the non-acicular diamond as the surface layer to the base material in an extremely secure manner.

The diamond-coated member prepared by using the process according to the present invention has excellent performance as comparable as conventionally available sintered diamond-coated member such as super hard tools coated with the sintered diamond. And it can appropriately be utilized in various fields of, for example, tools and various member which require a high degree of hardness and high abrasion resistance, such as various super hard tools, abrasion resistant tools and so on, including cutting tools and so on.

BEST MODE FOR CARRYING OUT THE INVENTION

The present invention will be further described by way of examples with reference to comparative examples.

EXAMPLE 1

As the base material, a WC-Co super hard alloy (JIS K10SPGN421) was used. On this base material, the diamond film was deposited with a film thickness of approximately 4 microns by known microwave plasma CVD method under the following conditions:
Raw material gas: Methane gas (diluted by $H_2$) in a concentration of 4% by volume
Reaction pressure: 40 torr
Surface temperature of base material: 850° C.
Reaction time: 5 hours Then, the resulting diamond film was treated by plasma etching under the following conditions, thereby forming an acicular diamond having an aspect ratio of approximately 4. The results of measurement by an electronic microscope and X-ray diffractiometry revealed that the tip surface of the acicular diamond has a [100] plane.
Etching gas: oxygen
Reaction pressure: 20 torr
Reaction time: 5 minutes Thereafter, on the resulting acicular diamond, the W was coated by the vacuum evaporation method under the following conditions:
Degree of vacuum: $10^{-5}$ torr
Surface temperature: 300° C.
Depositing speed: 1 nm per second
Evaporating time: 17 minutes The resulting surface coated with the W was then subjected to ultrasonic treatment in a liquid in which super fine powders of diamond were dispersed. After the ultrasonic treatment, a sample was prepared by depositing a diamond film with a film thickness of approximately 3 microns on the resulting coating of the W by means of the microwave plasma CVD method under the conditions which follow. It is to be noted herein that a groove was cut from the rear side of the sample with a diamond cutter and the sample was divided into two so as to readily observe a sectional shape of the resulting sample by scanning electronic microscope.
Concentration of raw material gas: Methane gas (diluted by $H_2$) in a concentration of 0.3% by volume
Reaction time: 5 hours Using the resulting sample (cutting tip), cutting tests were made under the following conditions:
Work: Al-Si(8% by weight) alloy
Cutting speed: 800 m/second
Delivery: 0.1 mm/rev
Cutting depth: 0.25 mm
Cutting time: 1,000 minutes After the cutting test, cut chips were removed from the sample with a dilute hydrochloric acid and a state of the tip of the sample was observed by scanning electronic microscope.

As a result, no separation of the diamond film was observed at all so that it was found that adhesion was extremely high.

EXAMPLE 2

The procedures were followed in substantially the same manner as in Example 1 with the exception that the synthesis of the diamond film as the first layer was carried out by using CO gas diluted with $H_2$ gas in a concentration of 50% by volume, as the raw material gas, the reaction was carried out for 5 hours, air was used as an etching gas, the etching was implemented for 10 minutes, $WSi_2$ was used as a work in place of W, CO (diluted with $H_2$ gas) in a concentration of 7% was used as a raw material gas for the synthesis of the diamond film as the second layer, and the reaction time was changed to 2 hours.

The height of the resulting acicular diamond was found to be approximately 10 microns, and the aspect ratio was approximately 6.5. The results of measurement by an electronic microscope and X-ray diffractiometry revealed that the tip surface of the acicular diamond was of a [100] plane and the film thickness of the non-acicular diamond was approximately 2 microns.

The cutting test provided an extremely good result as in Example 1.

EXAMPLE 3

The procedures were followed in substantially the same manner as in Example 1 with the exception that the diamond film was synthesized as the first layer by using per se known combustion flare method in place of the microwave plasma CVD method and a mixed gas of acetylene (at a feed speed of 4 liters per minute) and oxygen gas (at a feed speed of 4 liters per minute) as a raw material gas, the temperature of the base material in an open atmospheric system was changed to 850° C., the reaction time was shortened to 1 hour, the etching time was extended to 10 minutes, the diamond film as the uppermost layer was synthesized by using CO gas (diluted by $H_2$) in a concentration of 7% by volume was used as a raw material gas at the temperature of the base material of 1,000° C. and the reaction pressure of 40 torr for the reaction time of 2 hours.

The height of the resulting acicular diamond was found to be approximately 5 microns, and the aspect ratio was approximately 5.5. The results of measurement by an electronic microscope and X-ray diffractiometry revealed that the tip surface of the acicular diamond was of a [100] plane and the film thickness of the non-acicular diamond was approximately 2.5 microns.

The cutting test provided an extremely good result as in Example 1.

It is to be noted herein that for the samples obtained in Examples 1 to 3, inclusive, the results of observation by the scanning electronic microscope revealed that the intermediate layer was formed on the surface of the acicular diamonds and on the surface of the base material among the acicular diamonds as well.

EXAMPLE 4

The acicular diamond was deposited on the base material in substantially the same manner as in Example 1, except for changing the reaction pressure to 40 torr, the surface temperature of the base material to 850° C. and the reaction time to 15 minutes for the conditions of synthesizing the diamond film (as the first layer) on the base material, and changing the reaction pressure to 40 torr and the reaction time to 10 minutes for the etching conditions. Thereafter, a coating of W was formed in substantially the same manner as in Example 1, except for inclining the base material at 70 degrees to the source of evaporation in subjecting W to vacuum evaporation. Then, the non-acicular diamond was formed on the coating of W in the same manner as in Example 1.

The height of the resulting acicular diamond was found to be approximately 8.5 microns, and the aspect ratio was approximately 5.7. The results of measurement by an electronic microscope and X-ray diffractiometry revealed that the tip surface of the acicular diamond was of a [100] plane and the film thickness of the non-acicular diamond was approximately 3 microns.

The cutting test provided an extremely good result as in Example 1.

EXAMPLE 5

The acicular diamond was formed on the base material in substantially the same manner as in Example 2, except for synthesizing the diamond film on the base material using CO gas (diluted by $H_2$) in a concentration of 60% by volume for the reaction time of 10 hours at the surface temperature of the base material of 850° C. Thereafter, the procedures were followed in substantially the same manner as in Example 2 except for the formation of the intermediate layer by means of the thermal CVD method by using 5% of $SiH_4$ (diluted with argon) in place of $WSi_2$ at the surface temperature of the base material of 800° C. and the reaction pressure of 10 torr for the reaction time period of 10 minutes.

The height of the resulting acicular diamond was found to be approximately 2.3 microns, and the aspect ratio was approximately 7. The results of measurement by an electronic microscope and X-ray diffractiometry revealed that the tip surface of the acicular diamond was of a [100] plane and the film thickness of the non-acicular diamond was approximately 2 microns.

The cutting test provided an extremely good result as in Example 1.

For Examples 4 and 5, any non-acicular diamond was not formed in the interstices of the acicular diamond crystals nearby the base material and gaps were formed instead.

FIELD OF INDUSTRIAL UTILIZATION

The present invention can provide diamond-coated member, such as diamond-coated tools and so on, which has the diamond film having remarkably improved adhesion yet which can retain a sufficiently high degree of adhesion even if the substantial thickness of the diamond film would be made sufficiently thick, which has such excellent physical properties as being extremely unlikely to cause damages such as coming off, and which has excellent performance as comparable as members coated with a sintered diamond, such as conventionally available sintered diamond-coated super hard tools and so on.

The present invention can provide the process for the preparation of the diamond-coated member excellent particularly in adhesion and so on.

We claim:

1. A diamond-coated member comprising an acicular diamond layer, an intermediate layer formed by a metal belonging to either of the group IIIb, IVa, Va or VIa of the periodic table or by a compound containing said metal, Si or B, and a non-acicular diamond layer superimposed on the surface of a base material, wherein said acicular diamond layer is in direct contact with said base material.

2. A diamond-coated member as claimed in claim 1, wherein the base material is a metal, a sintered metal or a sintered ceramic.

3. A diamond-coated member as claimed in claim 1, wherein the base material is a super hard alloy.

4. A diamond-coated member as claimed in claim 1, wherein the acicular diamond layer has a thickness ranging from 0.1 micron to 100 microns and an aspect ratio ranging from 3 to 100.

5. A diamond-coated member as claimed in claim 1, wherein the intermediate layer comprises the metal belonging to the group VIa or the compound containing Si.

6. A diamond-coated member as claimed in claim 1, wherein the intermediate layer comprises W, $WSi_2$ or Si.

7. A process for the preparation of a diamond-coated member characterized in that a diamond layer is formed on the surface of a base material by vapor phase synthesis method; the resulting diamond layer is converted into acicular diamond by exposing the resulting diamond layer to a gas obtainable by exciting an oxygen-containing etching gas; an intermediate layer comprising a metal belonging to either of the group IIIb, IVa, Va or VIa of the periodic table or by a compound containing the said metal, Si or B is formed on the resulting acicular diamond; and the resulting intermediate layer is exposed to a gas obtainable by exciting a raw material gas containing a carbon source gas.

8. A process for the preparation of the diamond-coated member as claimed in claim 7, wherein the base material is a metal, a sintered metal or a sintered ceramic.

9. A process for the preparation of the diamond-coated member as claimed in claim 7, wherein the base material is a super hard alloy.

10. A process for the preparation of the diamond-coated member as claimed in claim 7, wherein the acicular diamond layer has a thickness ranging from 0.1 micron to 100 microns and an aspect ratio ranging from 3 to 100.

11. A process for the preparation of the diamond-coated member as claimed in claim 7, wherein the intermediate layer comprises the metal belonging to the group VIa or the compound containing Si.

12. A process for the preparation of the diamond-coated member as claimed in claim 7, wherein the intermediate layer comprises W, $WSi_2$ or Si.

* * * * *